US006800137B2

(12) United States Patent
Pandelisev

(10) Patent No.: US 6,800,137 B2
(45) Date of Patent: Oct. 5, 2004

(54) BINARY AND TERNARY CRYSTAL PURIFICATION AND GROWTH METHOD AND APPARATUS

(75) Inventor: Kiril A. Pandelisev, Mesa, AZ (US)

(73) Assignee: Phoenix Scientific Corporation, Mesa, AZ (US)

(*) Notice: Subject to any disclaimer, the term of this patent is extended or adjusted under 35 U.S.C. 154(b) by 57 days.

(21) Appl. No.: 10/086,624

(22) Filed: Mar. 4, 2002

(65) Prior Publication Data

US 2002/0092465 A1 Jul. 18, 2002

Related U.S. Application Data

(60) Continuation-in-part of application No. 10/011,762, filed on Dec. 11, 2001, which is a division of application No. 09/640,745, filed on Aug. 18, 2000, now Pat. No. 6,334,899, which is a division of application No. 09/504,961, filed on Feb. 16, 2000, now Pat. No. 6,153,011, which is a division of application No. 09/234,411, filed on Jan. 21, 1999, now Pat. No. 6,071,339, which is a division of application No. 08/490,893, filed on Jun. 16, 1995, now Pat. No. 5,993,540.

(51) Int. Cl.⁷ .............................................. C30B 9/04
(52) U.S. Cl. ..................... 117/212; 117/222; 117/223; 117/914
(58) Field of Search ................................ 117/212, 222, 117/223, 914

(56) References Cited

U.S. PATENT DOCUMENTS

| 2,498,186 A | 2/1950 | Stockbarger et al. |
| 2,550,173 A | 4/1951 | Swinehart et al |
| 2,739,088 A | 3/1956 | Pfann . |
| 2,902,350 A | 9/1959 | Jenny et al. |
| 2,932,562 A | 4/1960 | Pfann |
| 2,992,903 A | 7/1961 | Imber |
| 3,031,275 A | 4/1962 | Shockley |
| 3,036,898 A | 5/1962 | Brock et al. |
| 3,096,158 A | 7/1963 | Gaule et al. |
| 3,124,633 A | 3/1964 | Van Run |
| 3,234,009 A | 2/1966 | Siebertz |
| 3,249,404 A | 5/1966 | Bennett |
| 3,258,314 A | 6/1966 | Redmond et al. |
| 3,423,189 A | 1/1969 | Pfann |
| 3,433,627 A | 3/1969 | Liang et al. |

(List continued on next page.)

OTHER PUBLICATIONS

Pastor et al., *Crystal Growth in a Reactive Atmosphere*, Mat. Res. Bull., vol. 10 No. 4: 117–124, 1975.
Pastor et al., *Crystal Growth of KBr in a reactive atmosphere*, Mat. Res. Bull., vol. 10 No. 4: 261–266, 1975.

*Primary Examiner*—Robert Kunemund
(74) *Attorney, Agent, or Firm*—James Creighton Wray; Meera P. Narasimhan

(57) ABSTRACT

Reactive gas is released through a crystal source material or melt to react with impurities and carry the impurities away as gaseous products or as precipitates or in light or heavy form. The gaseous products are removed by vacuum and the heavy products fall to the bottom of the melt. Light products rise to the top of the melt. After purifying, dopants are added to the melt. The melt moves away from the heater and the crystal is formed. Subsequent heating zones re-melt and refine the crystal, and a dopant is added in a final heating zone. The crystal is divided, and divided portions of the crystal are re-heated for heat treating and annealing.

88 Claims, 10 Drawing Sheets

U.S. PATENT DOCUMENTS

| | | |
|---|---|---|
| 3,453,352 A | 7/1969 | Goundry |
| 3,505,032 A | 4/1970 | Bennett |
| 3,826,817 A | 7/1974 | Pastor et al. |
| 3,884,642 A | 5/1975 | Benedict |
| 3,935,302 A | 1/1976 | Pastor et al. |
| 3,959,442 A | 5/1976 | Pastor et al. |
| 4,036,595 A | 7/1977 | Lorenzini et al. |
| 4,036,666 A | 7/1977 | Mlavsky |
| 4,075,055 A | 2/1978 | Ciszek et al. |
| 4,108,714 A | 8/1978 | Keller et al. |
| 4,110,080 A | 8/1978 | Pastor |
| 4,190,487 A | 2/1980 | Pastor et al. |
| 4,196,041 A | 4/1980 | Baghdadi et al. |
| 4,200,621 A | 4/1980 | Liaw et al. |
| 4,226,834 A | 10/1980 | Shudo et al. |
| 4,242,175 A | 12/1980 | Zumbrunnen |
| 4,251,315 A | 2/1981 | Pastor |
| 4,273,608 A | 6/1981 | Kerlin |
| 4,277,303 A | 7/1981 | Swinehart |
| 4,312,849 A | 1/1982 | Kramer |
| 4,316,764 A | 2/1982 | Kudo et al. |
| 4,329,195 A | 5/1982 | Kudo |
| 4,330,358 A | 5/1982 | Grabmaier et al. |
| 4,357,200 A | 11/1982 | Grabmaier |
| 4,357,201 A | 11/1982 | Grabmaier et al. |
| 4,417,944 A | 11/1983 | Jewett |
| 4,419,177 A | 12/1983 | Pryor et al. |
| 4,428,783 A | 1/1984 | Gessert |
| 4,447,289 A | 5/1984 | Geissler et al. |
| 4,449,780 A | 5/1984 | Swinehart |
| 4,454,096 A | 6/1984 | Lorenzini et al. |
| 4,468,281 A | 8/1984 | Bender et al. |
| 4,478,880 A | 10/1984 | Belouet |
| 4,557,795 A | 12/1985 | Helda, deceased et al. |
| 4,563,979 A | 1/1986 | Falckenberg et al. |
| 4,591,633 A | 5/1986 | Susuki et al. |
| 4,599,245 A | 7/1986 | Falckenberg et al. |
| 4,640,023 A | 2/1987 | Mori et al. |
| 4,688,623 A | 8/1987 | Wakefield et al. |
| 4,690,797 A | 9/1987 | Eyer et al. |
| 4,696,734 A | 9/1987 | Gentry |
| 4,749,438 A | 6/1988 | Bleil |
| 4,762,687 A | 8/1988 | Belouet et al. |
| 4,775,443 A | 10/1988 | Bleil |
| 4,834,832 A | 5/1989 | Stock et al. |
| 4,837,376 A | 6/1989 | Schwirtlich et al. |
| 4,873,063 A | 10/1989 | Bleil |
| 4,968,380 A | 11/1990 | Freedman et al. |
| 4,981,528 A | 1/1991 | Fritzemeier et al. |
| 5,055,157 A | 10/1991 | Bleil |
| 5,069,742 A | 12/1991 | Bleil |
| 5,069,743 A | 12/1991 | Wysocki et al. |
| 5,106,266 A | 4/1992 | Borns et al. |
| 5,116,456 A | 5/1992 | Nestor |
| 5,178,719 A | 1/1993 | Pandelisev |
| 5,290,395 A | 3/1994 | Matsumoto et al. |
| 5,296,089 A | 3/1994 | Chen et al. |
| 5,324,488 A | 6/1994 | Klingshirn et al. |
| 5,360,480 A | 11/1994 | Altekruger |
| 5,456,735 A | 10/1995 | Ellison-Hayashi et al. |
| 5,690,734 A | 11/1997 | Imaeda et al. |
| 5,919,304 A | 7/1999 | Imaeda et al. |
| 5,961,720 A | 10/1999 | Imaeda et al. |
| 5,993,540 A | 11/1999 | Pandelisev |
| 6,071,339 A | 6/2000 | Pandelisev |
| 6,153,011 A | 11/2000 | Pandelisev |
| 6,334,899 B1 | 1/2002 | Pandelisev |
| 2002/0040675 A1 * | 4/2002 | Pandelisev .................... 117/33 |
| 2002/0053317 A1 * | 5/2002 | Pandelisev .................... 117/84 |
| 2002/0062784 A1 * | 5/2002 | Pandelisev .................. 117/206 |

\* cited by examiner

BINARY AND TERNARY CRYSTAL PURIFICATION AND GROWTH METHOD AND APPARATUS

This application is a continuation-in-part of application Ser. No. 10/011,762 filed Dec. 11, 2001, which is a division of application Ser. No. 09/640,745 filed Aug. 18, 2000, now U.S. Pat. No. 6,334,899, which is a division of application Ser. No. 09/504,961 filed Feb. 16, 2000, now U.S. Pat. No. 6,153,011, which is a division of application Ser. No. 09/234,411 filed Jan. 21, 1999, now U.S. Pat. No. 6,071,339, which is a division of application Ser. No. 08/490,893 filed Jun. 16, 1995, now U.S. Pat. No. 5,993,540.

BACKGROUND OF THE INVENTION

This invention relates to the purifying of crystal material, the doping of the material and the growth of crystals.

Bridgeman, Bridgeman-Stockbarger, Czochralski and variations have been used for crystal growth. Depending on the crystal growth method, the crystal type and the crystal size, one has to overcome sets of problems. This invention relates to the purification of the crystal material and the crystal growth process itself.

Crystal size and the quality of the crystal starting material play important roles in the production of scintillation crystals. The starting material labeled "scintillation grade" is of five 9's purity 0.9999%. Often the starting material has poor stoichiometry ratio. Growing crystals in a closed type system that have large diameters and up to over 2000 pounds in weight result in crystals that have poor crystal quality. Crystal purity, dopant distribution, defect density and distribution and built-in stress imposed on the crystal during the crystal growth process and the crucible removal may be at unacceptable levels. With the exception of small crystal portions grown at the beginning of the crystal growth, crystals may have lower purity than the starting material. Dopant concentration varies dramatically. That in turn creates uneven light output and decreases the energy resolution of scintillation crystals. When handling large size crystals during the hot transfer, the crystals release large portions of iodine and thallium iodine vapors. Exposure to ambient temperature creates various defects and defect densities in the hot crystals.

The current practices where large barrel-shaped crystals are grown for all applications, regardless of the fact that most applications use rectangular shapes, makes the yields rather low. Scaling up crystal plate sizes from 0.5–1 inch thick slabs cut perpendicular to the crystal length of a barrel-shaped crystal requires large financial investments. At the same time increasing slab geometry increases the crystal production cost by decreasing the growth rate and lowers the crystal quality and yield.

Existing purification methods include supplying a gaseous medium to a surface of a melt carried in a crucible. Those methods require extended times for purification, up in the range of 96 hours. Those methods also ineffectively cure the melt, as lower portions of the melt are never purified.

During melt purification, impurities react with the gas molecules and exit the melt in a gaseous phase. Some impurities react and precipitate from the melt as a sludge. Other reacted impurities float to the surface.

Needs exist for purification systems that remove impurities faster and more efficiently.

These problems and many more remain in the present practices. Needs exist for new approaches for crystal material purification and the crystal growth processes.

Purifying of crystals by reactant gas contact in current systems results in delays and adds significant times to the crystal growth process.

SUMMARY OF THE INVENTION

Reactive gas is released through a crystal source material or melt to react with impurities and carry the impurities away as gaseous products or as precipitates or in light or heavy form. The gaseous products are removed by vacuum and the heavy products fall to the bottom of the melt. Light products rise to the top of the melt. After purifying, dopants are added to the melt. The melt moves away from the heater and the crystals formed. Subsequent heating zones re-melt and refine the crystal, and a dopant is added in a final heating zone. The crystal is divided, and divided portions of the crystal are re-heated under pressure for heat treating and annealing.

The invention provides multi zone plate crystal growth and purifying.

The new continuous feed multi-zone crystal grower is capable of growing crystals with very large dimensions under reactive atmospheres. The invention produces high purity crystals with very uniform doping concentrations regardless of the crystal size. The dopant level and the residual impurities are controlled in situ within the crystal feed chamber and during the crystal growth process. Crystal applications include nuclear medicine, high energy physics, optics and others where economical production of high purity and large size crystals are required.

The invention provides horizontal (or inclined under some angle) continuous crystal growth process for plates of any dimensions.

Reactive gas permeates start-up material, crystal powder or polycrystalline material or a crystal melt.

Stoichiometry control or "repair" of start-up material is achieved using the present invention.

Multi-zone traveling, stationary immersed and non-immersed heaters, resistive and RF heating elements, or other type heaters are used. This allows controlled gradient crystal growth of any size crystals.

A traveling crucible or crystal slab can be used if the heaters are stationary.

The present invention can be attached as a module to heaters for in situ purification and dopant control.

Dopant concentration control can be achieved by adding dopant in solid or gaseous form. If excess dopant has to be controlled, the excess is either neutralized via chemical reaction or by dilution with pure melt.

For very high purity crystals or crystals with very large sizes, residual impurities control can be achieved by removing the melt from one of the molten zones via vacuum suction and melt draining.

High temperature and high pressure annealing of the plates in final sizes enhances the crystal quality properties.

The invention eliminates cutting of at least one dimension of the crystal before further processing.

A preferred continuous crystal plate growth apparatus has a source of starter material. A valve supplies material from the starter material source. A first, hot zone communicates with the valve for heating the material. A dopant source and a dopant controller are connected to the hot zone for supplying dopant into the material in the hot zone. A second reduced heat zone beyond the hot zone reduces heat in the material, which forms a solid plate. A receiver receives the solid plate from the second, reduced heat zone and advances the solid plate. A lowered temperature heating zone adjacent the receiver lowers temperature of the solid crystal plate on the receiver. An enclosure encloses the zones and the solid crystal plate in a controlled gaseous environment.

A large heater overlies the small heater. The large heater has first and second zones, and the small heater has the first hot and second reduced heat zones. Baffles separate the first and second zones of the heaters.

The first zone of the small heater produces a crystal melt temperature higher than a crystal melting temperature in the material. The second zone of the small heater produces a temperature lower than the melting temperature. The temperature in the material at the small heater baffle is about the melting temperature. The large heater first zone provides heat below the melting temperature, and the large heater second zone provides a lower heat.

Preferably the receiver is a conveyor which moves at a speed equal to a crystal growth rate.

A second source of starter material and a second valve are connected to the hot zone for flowing material from the second source to the hot zone.

The crystal melt or starter material is purified in a chamber having a bottom and sides. A lid covers the chamber. An opening introduces liquid or solid material into the chamber. An outlet near the bottom of the chamber releases crystal melt or starter material from the chamber. A shut-off valve opens and closes the outlet. A source of reactive gas is connected to the chamber and extends into a bottom of the chamber. A reactive gas release barrier near the bottom of the chamber slowly releases reactive gas into the crystal starter material. A gas space is located at the top of the chamber above the crystal melt or starter material. An exhaust line is connected to the space at the top of the chamber for withdrawing gas from the top of the chamber. A heater adjacent the chamber heats the chamber and the crystal melt or starter material within the chamber.

The heater has heating elements around sides of the chamber and along the walls of the chamber.

The shut-off valve is a thermally activated or a mechanical or electromechanical valve.

An inlet conduit is connected to the lid. A source of reactive liquid or solid is connected to the inlet conduit. A valve is connected between the source of reactive liquid or solid. A plug is connected to the conduit for plugging the conduit after adding reactive liquid or solid to the chamber.

Preferably a vacuum pump is connected to the exhaust line. A preferred barrier is a porous plate.

In one heating and purifying embodiment, a chamber has an inlet and an outlet. A purified material discharge is connected to the outlet. An enclosure has side walls, a bottom and a top. A reactive gas source is connected to a gas inlet tube. A gas distributor is mounted in the chamber near the bottom. A gas releasing plate connected to the gas distributor releases the reactive gas from the inlet tube and the distributor into the material in the feeding and purifying chamber. A heater heats material in the chamber. A gas exhaust exhausts gas from an upper portion of the chamber.

A preferred casing has a cover and side walls, and the casing side walls include the chamber side walls.

In one embodiment, an upper heater has heating elements across a top of the chamber.

The apparatus moves with respect to a stationary base for supporting a growing crystal.

Preferred crystal growth embodiments have a support for supporting a growing crystal. A first zone heater adjacent the growing crystal heat and liquefies the growing crystal. A second zone heater spaced from the first zone heater along the growing crystal re-liquefies the growing crystal. Preferably multiple zone heaters are spaced from each other along the growing crystal for sequentially liquefying the growing crystal. Preferably the first zone heater further includes heating and purifying apparatus for purifying the crystal melt. A preferred first zone heater includes a reactive gas distributor for distributing reactive gas from near a bottom of the crystal melt.

A liquid or solid adaptive substance source releases liquid or solid reactive substance into the melt.

A source of dopant is connected to the last zone heater for supplying dopant into the crystal melt.

In one embodiment the support is a movable support for moving the liquid crystal along zone heaters. Alternatively, the zone heaters move along the crystal.

One crystal growth embodiment has a chamber for holding a crystal melt. A crystal support holds a crystal movable with respect to the chamber for forming a bottom of the chamber with the crystal. A first heater adjacent the chamber heats and maintains a crystal melt within the chamber. A baffle is connected to the first heater adjacent a bottom of the chamber. A second heater is connected to the baffle beyond the first heater. A source of reactive gas feeds a gas tube connected to a controller. A distributor is connected to the gas tube and is mounted in the chamber for positioning within the crystal melt. A gas releaser connected to the distributor releases reactive gas into the crystal melt. A gas exhaust is connected to the chamber exhausts gas from the chamber above the crystal melt. An inlet tube and a controller release reactant substance into the chamber and into the crystal melt. A dopant conduit and a dopant source provide a dopant from the source through the conduit to the chamber. The reactive substance and the reactive gas control the dopant.

These and further and other objects and features of the invention are apparent in the disclosure, which includes the above and ongoing written specification, with the claims and the drawings.

DETAILED DESCRIPTION OF THE PREFERRED EMBODIMENTS

Figure 1:
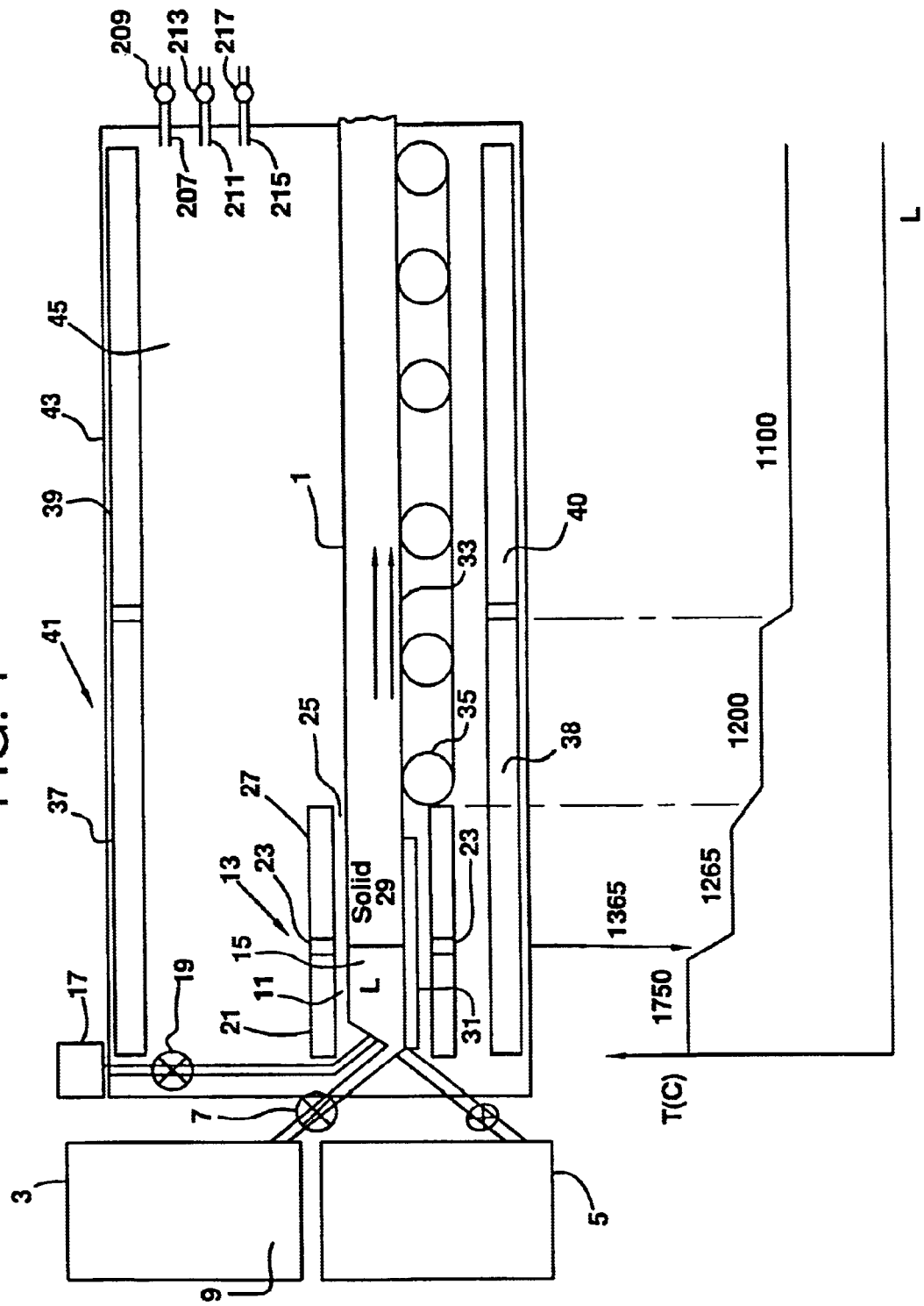
FIG. 1 shows an apparatus and process for continuous crystal plate growth.

Referring to the drawings, a crystal 1 is grown in a continuous process by first purifying a crystal source material, which is a crystal melt or powder, in a purification station 3, as later will be described. A second purification station 5 may be provided so that the crystal melt or powder may be prepared in a batch process within alternating stations, which may number several stations. The supply and refill stations 3 and 5 may be of any type.

Valves 7 control the flow of purified crystal melt or purified crystal source powder 9 to a first hot zone 11 of a first heater 13. The first hot zone 11 has a temperature which is above the melt temperature of the crystal. A boat-shaped container holds the liquefied crystal 15.

A source and multiport 17 has a controller 19 which controls the material added to the liquefied crystal 15. The material may be multiple or single materials such as gaseous or liquid dopant or any material.

The first heater 21 surrounding the first hot zone 11 produces a heat above the melting temperature of the crystal. A baffle 23 next to the first heater separates the first heat zone 11 from the second heat zone 25. Heaters 25 and 27 may be multizone heaters. The second heater 27 which surrounds the second zone produces a temperature in the second zone which is below the melt temperature of the crystal, so that a crystal solid interface 29 exists in the vicinity of the baffle between the liquefied crystal 15 and the formed crystal 1. The liquefied crystal, the liquid solid interface and the first portion of the crystal are supported in a boat-shaped crucible container with a bottom 31 and side walls which support the crystal. As the crystal leaves the support plate 31 it passes on to a conveyor 33 with supporting rollers 35, which continually move the crystal away from the first heater. The crystal moves within an enclosure 43, which has a noble gas or noble gas and reactant gas atmosphere 45.

A large heater has a first zone 37 which heats the initial part of the crystal apparatus to a temperature below the melt temperature, and a second zone 39 which maintains the crystal at a lower temperature. The first and second zones may have multiple sub zones. The bottom portions 38 and 40 may be separate heaters or separate zones.

A purified and doped crystal emerges from the enclosure.

In one example, as shown in the chart at the bottom of FIG. 1, when using the continuous crystal growth apparatus and process to grow a doped sodium iodide crystal, the first hot zone is maintained at about 1750° C.

The crystals may be binary and ternary. The temperature at the baffle is maintained at the melting point of the material, which in the case of a binary crystal, for example Ca $F_2$ or a ternary crystal, for example, $Ca_x Ba_{1-x} F_2$, is about 1365° C. The second zone of the first heater maintains a temperature of about 1265° C., or below the temperature of melting. The larger heater 41 has two zones 37 and 39, which provide heat below the temperature of zone 25, or at about 1200° C. and about 1100° C. respectively, so that the crystal uniformly cools as it proceeds. The heaters and zones may be divided into multiple zones and sub zones of varied heat and temperatures. The temperatures are controlled at levels according to the crystal being grown.

In FIG. 1 the crystal may be held stationary while the chamber moves, or while the heaters 21 and 27 move.

Enclosure 43 is double or multiple walled with interposed insulation or gaps which may be gas filled or evacuated to control temperatures inside the enclosure. An installation layer may be provided between the heaters 37, 38, 39, 40 and the enclosure 43. A multiport 207 with a valve 209 supplies inert or reactive gas or plasma to the atmosphere 45 within the chamber. A reduced pressure or vacuum port 211 with a valve 213 withdraws gas from the chamber. A plasma port 215 with a plasma valve 217 and generator is attached anywhere on the chamber.

Figure 2:
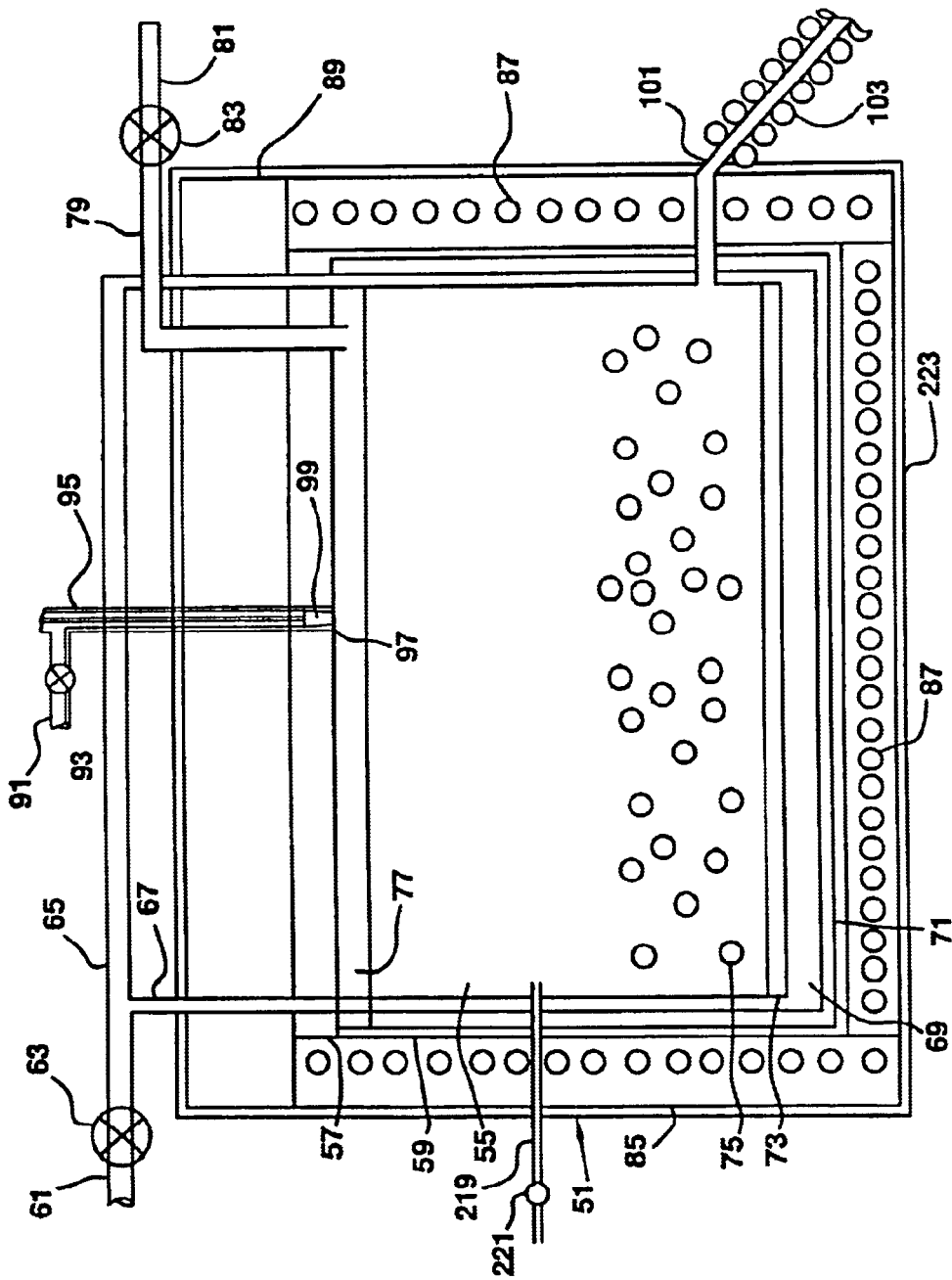
FIG. 2 shows a chamber for purifying crystal material and liquid or solid scavengers. The crystal material may be a starter powder or a crystal melt. The purifier in FIG. 2 may be used to supply the continuous crystal plate growth apparatus and process shown in FIG. 1.

As shown in FIG. 2, a crystal purifying apparatus and process is generally referred to by the numeral 51. The apparatus has a chamber 53, which is preferably a quartz chamber, for holding a crystal melt 55, or alternatively for holding crystal-forming powder used to create a crystal melt. The chamber has a lid 57, which may be a quartz lid, which tightly seals with upper edges of the walls 59 of the chamber 53. A multipoint inlet 61 which may provide inert, reactive gas or plasma is controlled by a valve 63, which supplies inert or reactant gas or plasma to a pipe 65. A plasma source 219 with a valve 221 is positioned on the enclosure and delivers plasma in the material directly, through a porous distributor or above the material. Tubes 67 conduct the reactant gas to a distributor 69 at or near the bottom 71 of the chamber 53. As shown in FIG. 2, the distributor may be a plenum. Gas is released from the plenum through a gas release plate 73, which in this case may be a porous quartz plate. Positive reactant gas pressure is maintained within the plenum 69 so that the gas flows upward through the port plate 73. A suitable reactant gas, for example, may be bromine mixed with argon or helium or a noble gas. The entire gas mixture is called the reactant gas, although only the bromine may be <actually reactant. Bromine, for example, may form gaseous bromides which are removed as gases from the melt or powder 55.

The flow of gas through the melt or powder is represented by the gas pockets or bubbles 75, which move upward. The flow of gas also entrains any water in the crystal material and carries the water from the heated crystal material as gaseous water vapors which are removed from the space 77 at the top of the chamber through a reduced pressure line 79 or vacuum line, which is connected to a source of reduced pressure or a vacuum 81, as controlled by a valve 83. The vacuum line 79 withdraws water vapor and reacted gas products. Solid impurities fall to the bottom of the material 55 when the material is in melt, and light solid impurities migrate upward to float on the top of the melt. Heaters, generally indicated by the numeral 85, surround the chamber.

The heaters 85 and 87 can be inside or outside the chamber and may have multiple separately controlled zones to heat the powder material or maintain the high temperature necessary for melting and maintaining the melt 55. At the top of the heaters a large insulating block 89 is placed to maintain the uniform temperature within the apparatus.

A source 91 of liquid or solid reactant substance is controlled by a controller 93 for supply to a conduit 95, which extends through the insulation 89 and lid 57 to an opening 97, which is controlled by a removable plug 99, so that the appropriate scavenging liquid or solid may be added to the melt 55. The conduit 95 acts as a multiport and supplies an access for solid, liquid starter material or other material.

The purified liquid or powder is removed through an outlet 101 in a side wall of the chamber 53 slightly above the bottom.

A shut-off valve is used in the supply line 101. The shut-off valve may be a mechanical valve or an electromechanical solenoid operated valve, or a thermally operated valve 103, such as shown in FIG. 2. The outlet 101 may be composed of plural outlets positioned anywhere on the chamber sides or bottom. The thermally operated valve is a series of cooling and heating coils which freeze or melt the crystal and allow flow of liquid crystal through the conduit 101.

An enclosure 223 surrounds a space 225 or insulation between the enclosure and the chamber outer wall 227. The enclosure can have a single or double wall with an interposed temperature controlling material.

Figure 3:
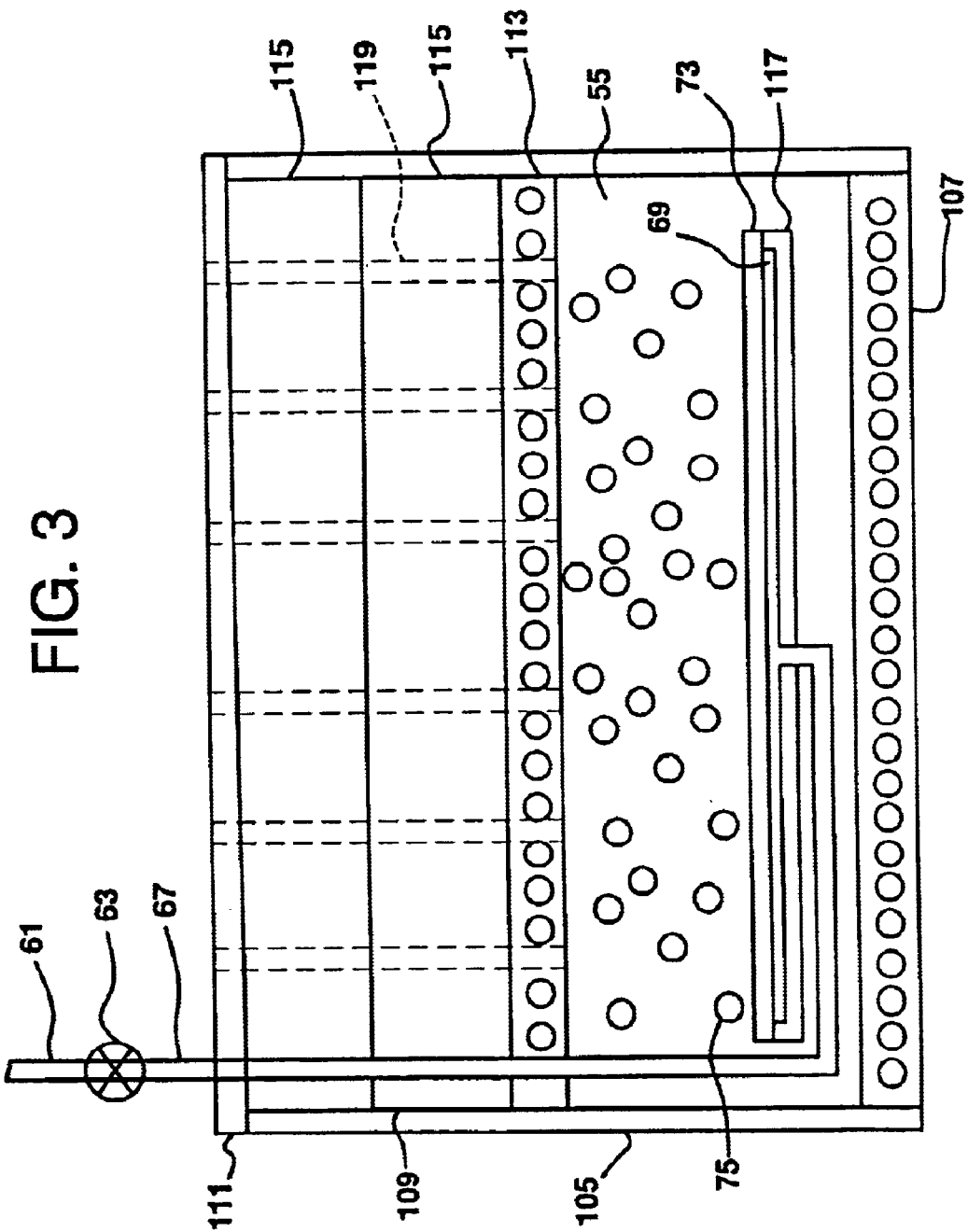
FIG. 3 shows a crystal melt purifier for use in a continuous crystal plate growth apparatus and process, such as shown in FIG. 1.

FIG. 3 shows an alternate heating and purifying apparatus and process in which a crystal melt 55 is held between side walls 105 and the base 107 of a casing 109, which has a cover 111. An upper heater 113 encloses the crystal melt. Insulation layers 115 above the upper heater 113 concentrate and reduce outward flow of the heat.

Reactant gas from a source 61 is admitted through a control valve 33 to a reactant gas tube 67, and from there into a distributor plenum 69 within a distributor housing 117. A porous quartz plate 73 covers the distributor and releases gas in the form of bubbles 75 through the melt 55. The released gas can be inert gas, reactive gas, plasma or mixtures thereof.

Gaseous reactant products and water vapor escape through small openings 119, which extend through the heater 113, the insulation 115 and the cover 111. Large openings 119 may be supplied for the addition of liquid or solid reactant substances or dopants.

Figure 4:
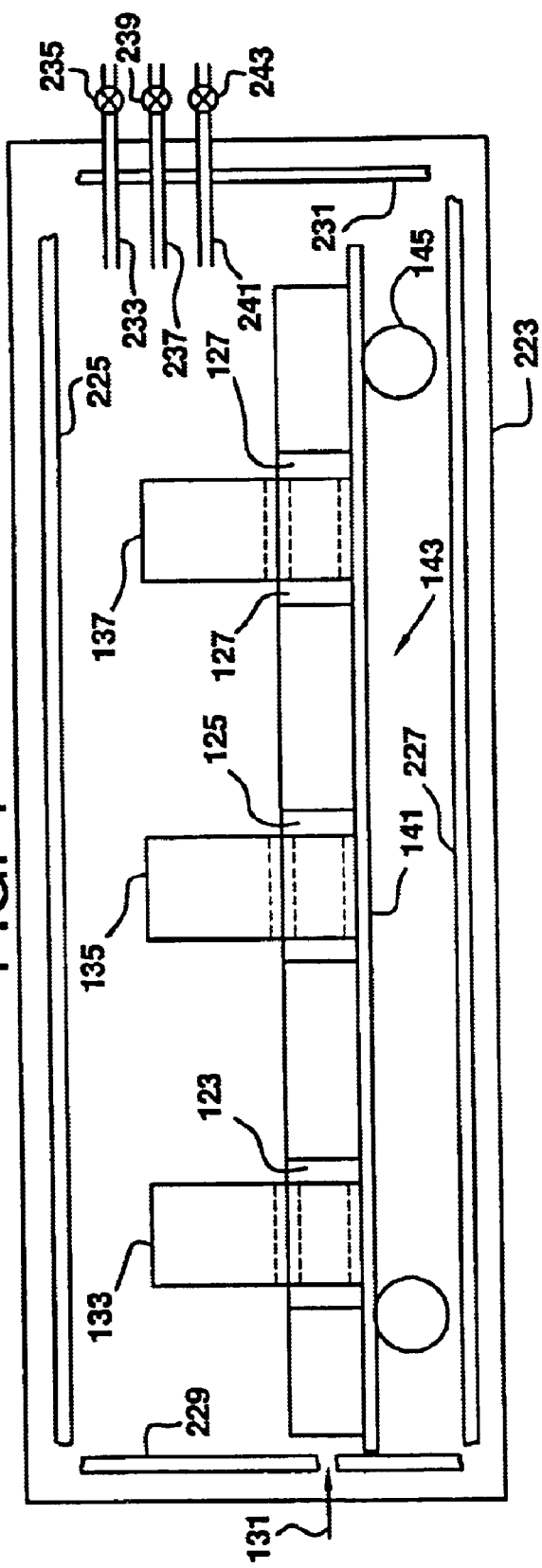
FIG. 4 shows a continuous crystal plate growth apparatus and process using multiple zone heating and purifying.

FIG. 4 shows a multiple heater arrangement 121 for zone heating and liquefaction 123, 125 and 127 as the crystal 1 moves in the direction 131 with respect to the zone heaters 133, 135 and 137. The sequential melting of the crystal further purifies the crystal. In the final melting operation, such as in heating and purifying apparatus 137, the dopant is added to the crystal.

Figure 5:
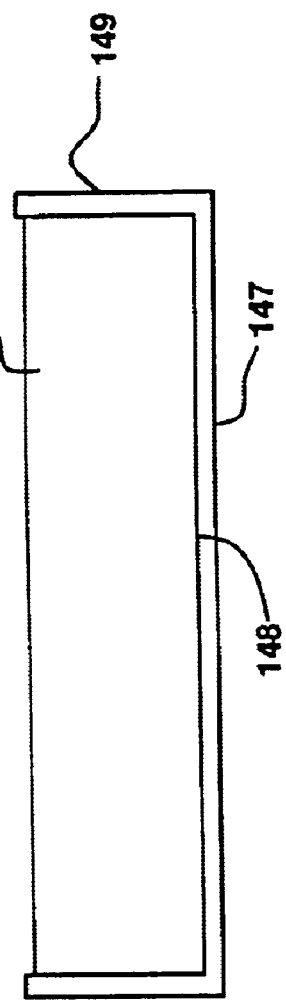
FIG. 5 is a detail of sides of the crystal growth apparatus in the melt zones.

The crystal may move through the assembly of heating and purifying apparatus such as on a support 141, which is part of a conveyor 143 supported by rollers schematically indicated at 145. Preferably, in the areas of the melt zones 123, 125 and 127, as shown in FIG. 5, the liquefied crystal is supported within a boat-shaped trough 147 with a base 148 and side walls 149, which are formed of quartz or ceramic. As the molten material solidifies and crystallizes, the individual crystal portions may be picked up by conveyors, or the entire crystal 1 may move along a rigid and smooth quartz or ceramic surface of a support 141.

Alternatively, the heating and purifying assemblies 133, 135 and 137 may be constructed for movement along a stationary crystal. An enclosure 223 surrounds the assemblies. The enclosure may have double walls and insulation. Heaters 225–231 heat the enclosure and the crystal. The heaters have individually controlled zones. A vacuum outlet 233 with a valve 235 is connected to the enclosure 223. An inert gas reactant gas or plasma entry multiport 237 is controlled by multiple valves 239. At least one plasma port 241 is connected through the enclosure and is controlled by valve 243.

Figure 6:
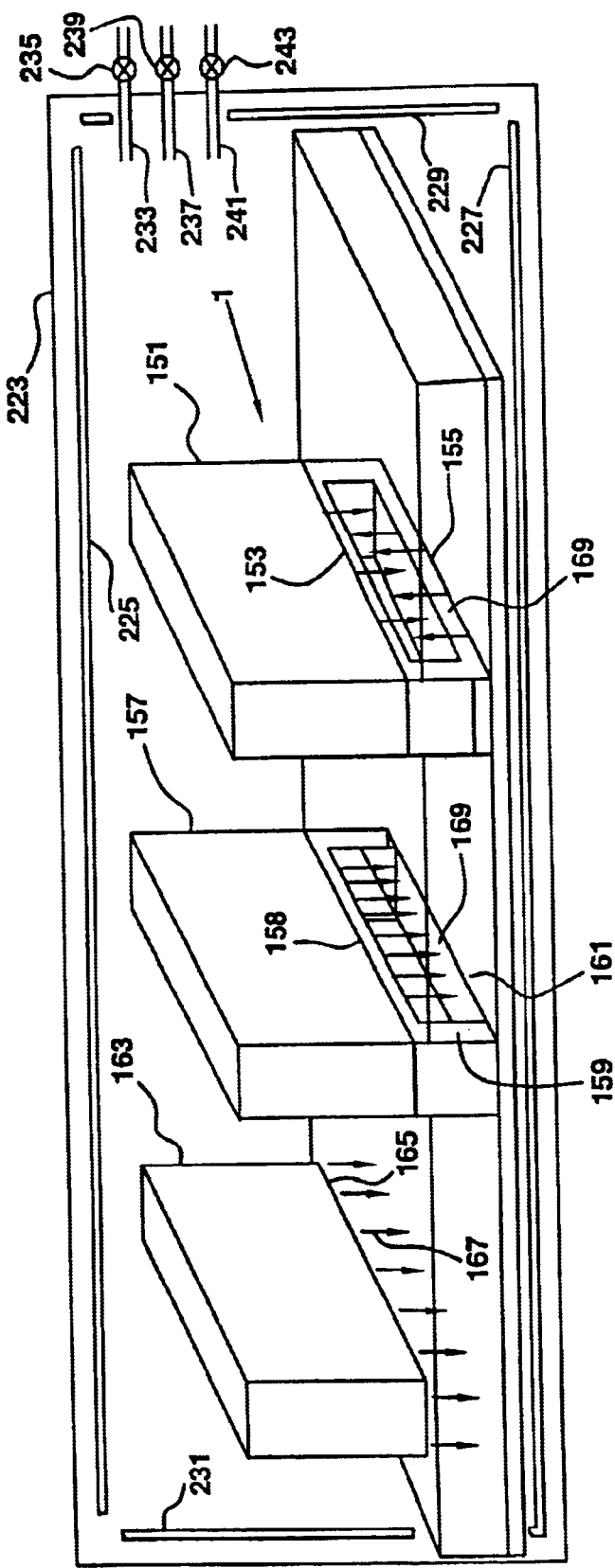
FIG. 6 shows varied heaters for use in the continuous heat crystal growth process.

FIG. 6 shows three configurations of heating and purifying apparatus shown melting and purifying a crystal. The heaters may be used sequentially as different heaters, or each of the heaters in a sequence may be identical. Heating element 151 has an upper heater 153 and a lower heater 155, which melt the crystal 1 as it flows between the heating elements. The heating and purifying apparatus 157 has an upper heater 158 and side heaters 159. The bottom 161 may be opened so that the crystal or heater may move and so that the melted crystal may be uniformly supported through the heating area. Alternatively, the heating elements may extend entirely around the liquid crystal area.

Heater 163 radiates heat downward from a thermal radiator 165, such as a quartz heating element or a wide laser beam, or a series of laser beams, or simply a strong standard heater. The heat flux 167 heats and melts the crystal material.

As shown in heating and purifying elements 151 and 157, the height of the heater openings may be equal or larger than the melt thickness. Alternatively, the opening 169 may be smaller than the melt thickness so that the crystal moves faster through the melt zone than through the approach. In one example, such as when melting and purifying a sodium iodide crystal in multiple melting zones, the crystal may move at a speed of slightly less than one foot per day. FIG. 6 shows relatively movable heaters and crystal mounted within an enclosure 223 with heaters 225–231 and ports and valves 233–243.

The crystals shown in FIGS. 4, 5 and 6 are examples of cross-sections of crystals which may have any shape, for example rectangular, round, oval, triangular, and may have at least one dimension as small as a seed of a crystal. The apparatus of FIGS. 4–6 may be positioned or used within or in conjunction with the apparatus and methods shown in FIG. 1.

Figure 7:
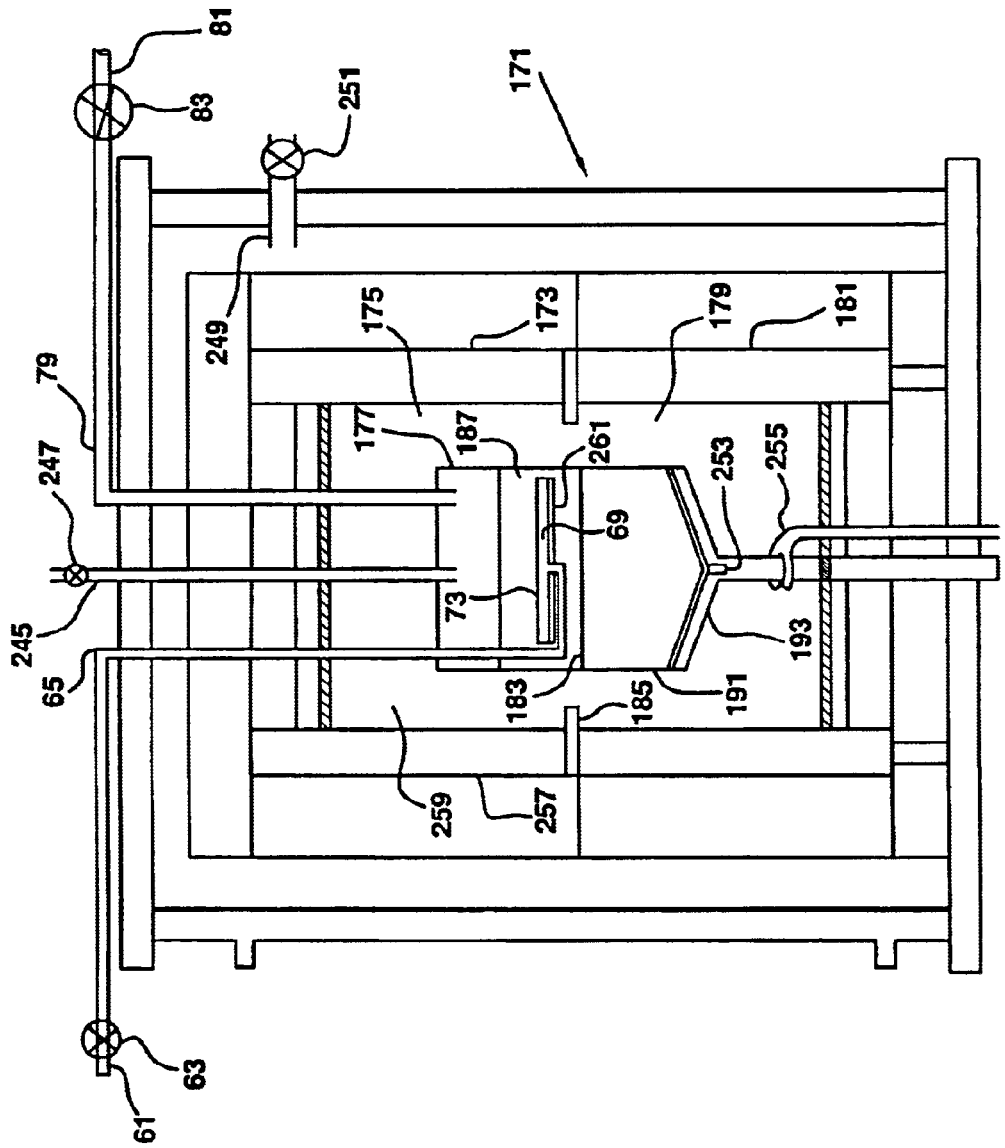
FIG. 7 shows the use of the present purifying apparatus and process in a vertical Bridgeman crystal growth system.

As shown in the FIG. 7, the present purifying apparatus and process may be used in a standard Bridgeman crystal growth apparatus 171. The crucible may be shaped as a plate, round, or polygonal and may have any cross-section. An upper heater 173 heats a zone 175 around melt chamber 177 to a temperature above the melting temperature. A baffle below heater 173 separates heat zone 175 from heat zone 179, in which heat from a heater 181 is below the melting temperature of the crystal. A liquid-solid interface 183 of the crystal occurs at about the position of the baffle 185. Reactant purifying gas, insert gas, plasma or a combination is admitted to the melt 187 through a multiport source 61 and a control 63, and a tube 65 leading to a distributor 69, which releases reactant gas through a porous plate into the crystal melt 187. Distributor 69 may have any desired shape or may be composed of multiple distributor combinations. Gasified impurities are removed through vacuum line 79, as controlled by valve 83 to a source of reduced pressure 81. The crystal 191 is contained in a platinum or quartz crucible 193.

A plasma port 245 and control valve 247 are connected to the crucible. A vacuum port 249 and control valve 251 are connected to the apparatus 171. A crystal starter seed 253 is provided in the crucible. A seed temperature control 255 is positioned at the base of the crucible. Heaters 257 and 259, like heaters 173 and 175, are multizone controlled heaters near the crucible. Gas distributor 69 may include a heater 261, which may have a shape and size matched to the inside of the crucible. The gas line 65 to the distributor 69 may come from the top. The internal heaters 261 may have separate controlled zones and are mounted below the distributor to face the liquid solid interface 183.

Figure 8:
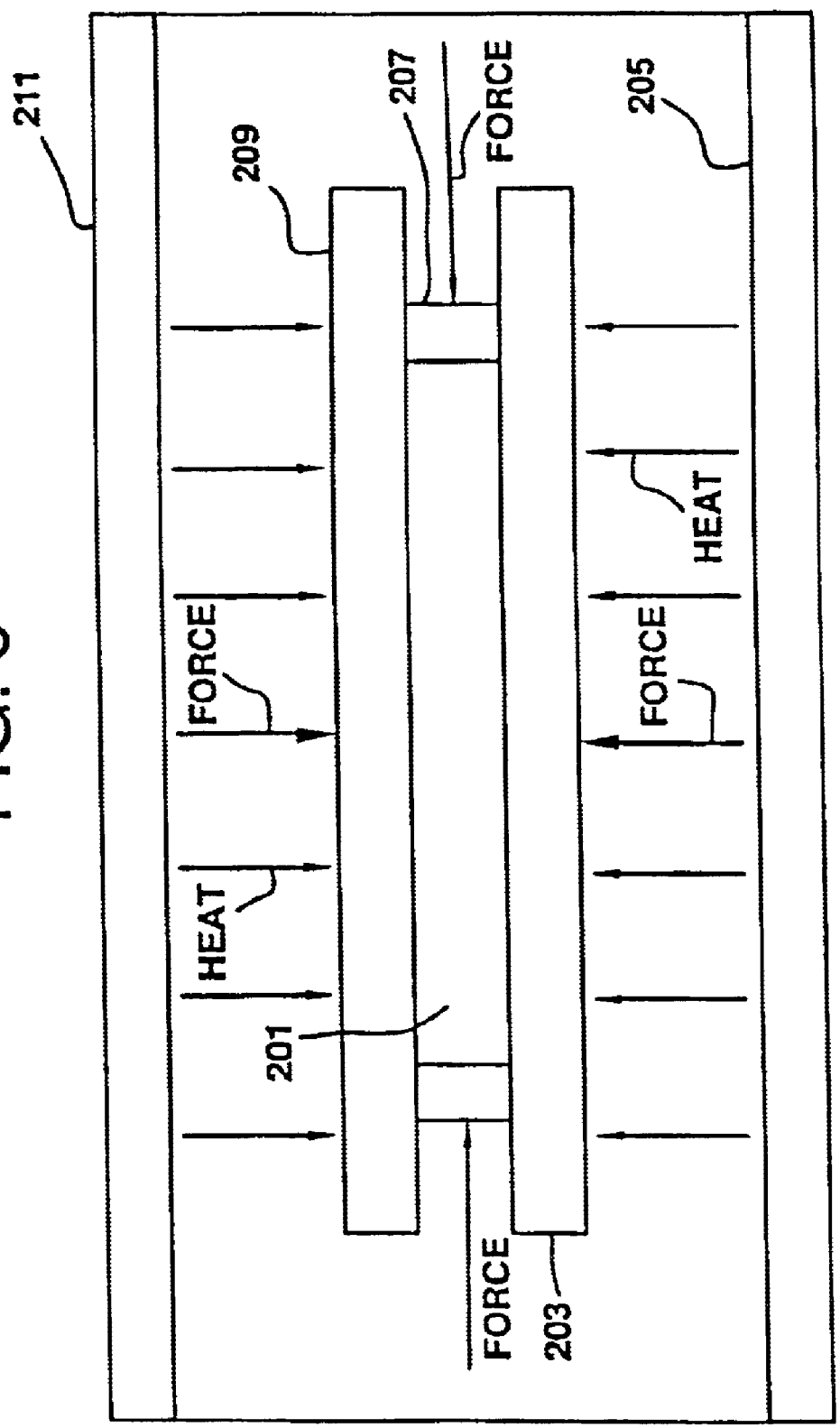
FIG. 8 is a schematic representation of the heat treating and annealing of a cut crystal before use.

As shown in FIG. 8, the final product, which is a crystal 201 which has been cut from the long crystal plate, is placed in a support 203 on a substrate 205, and sides and end surfaces are covered by plates 207 and a cover 209 is placed over the crystal. All of the entire system is enclosed. The entire system is enclosed in a crystal furnace 211 that provides the necessary temperature for the heat treating an annealing process while force is applied to the crystal 201 through the cover and walls 209 and 207.

Figure 9:
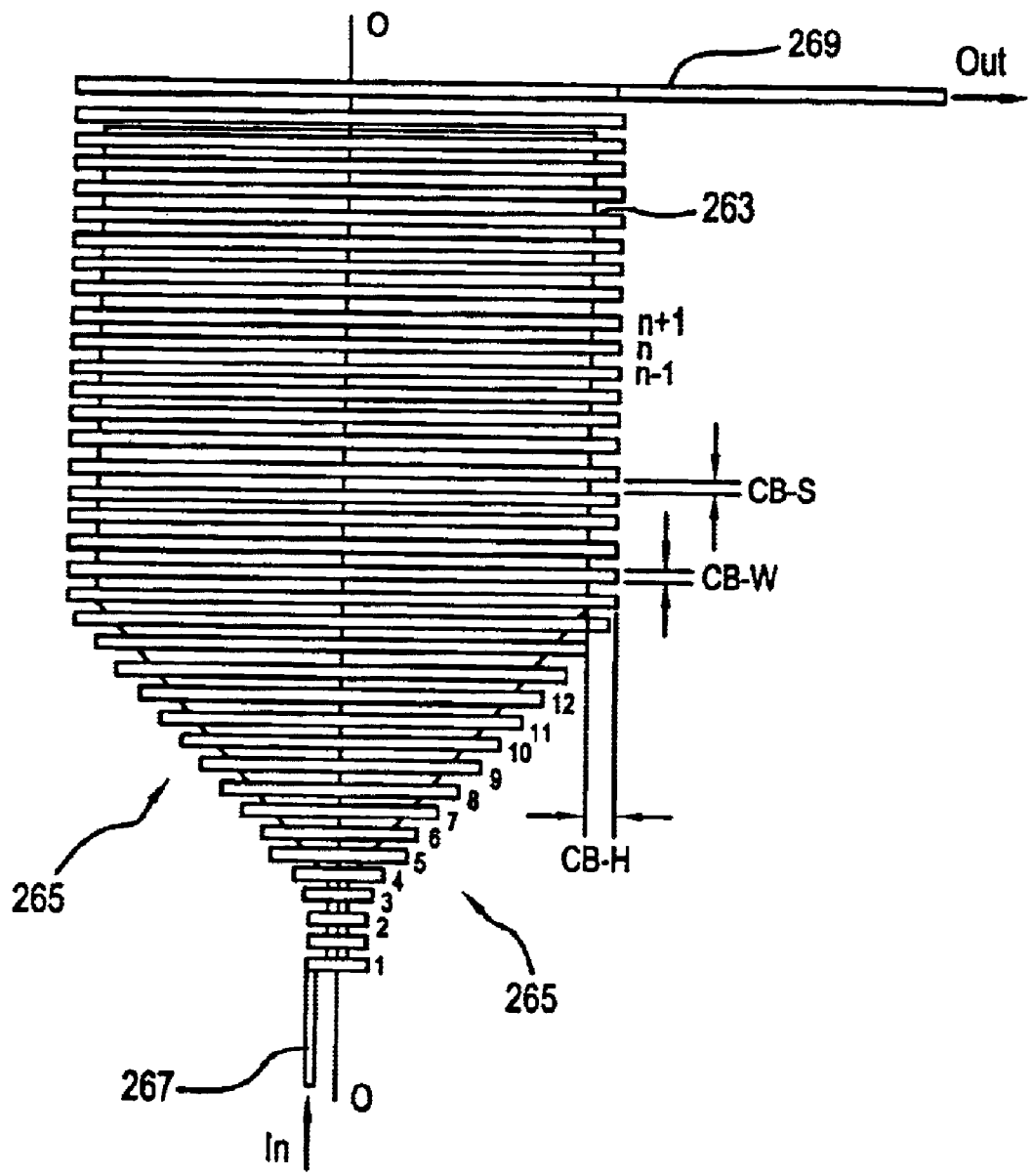
FIG. 9 is a schematic representation of a dynamic temperature control apparatus.
Figure 10:
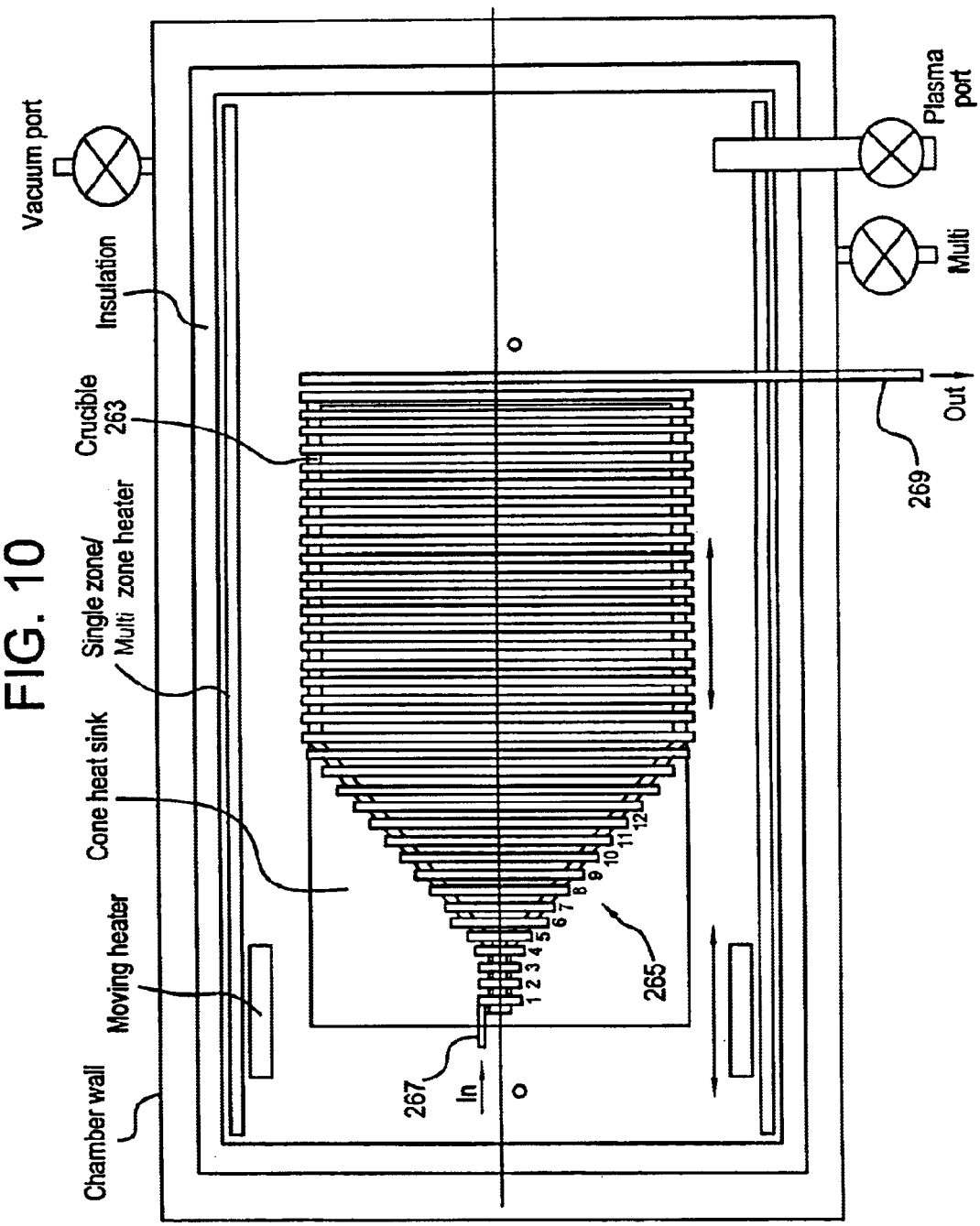
FIG. 10 is a schematic plan view of a dynamic temperature control apparatus.
Figure 11:
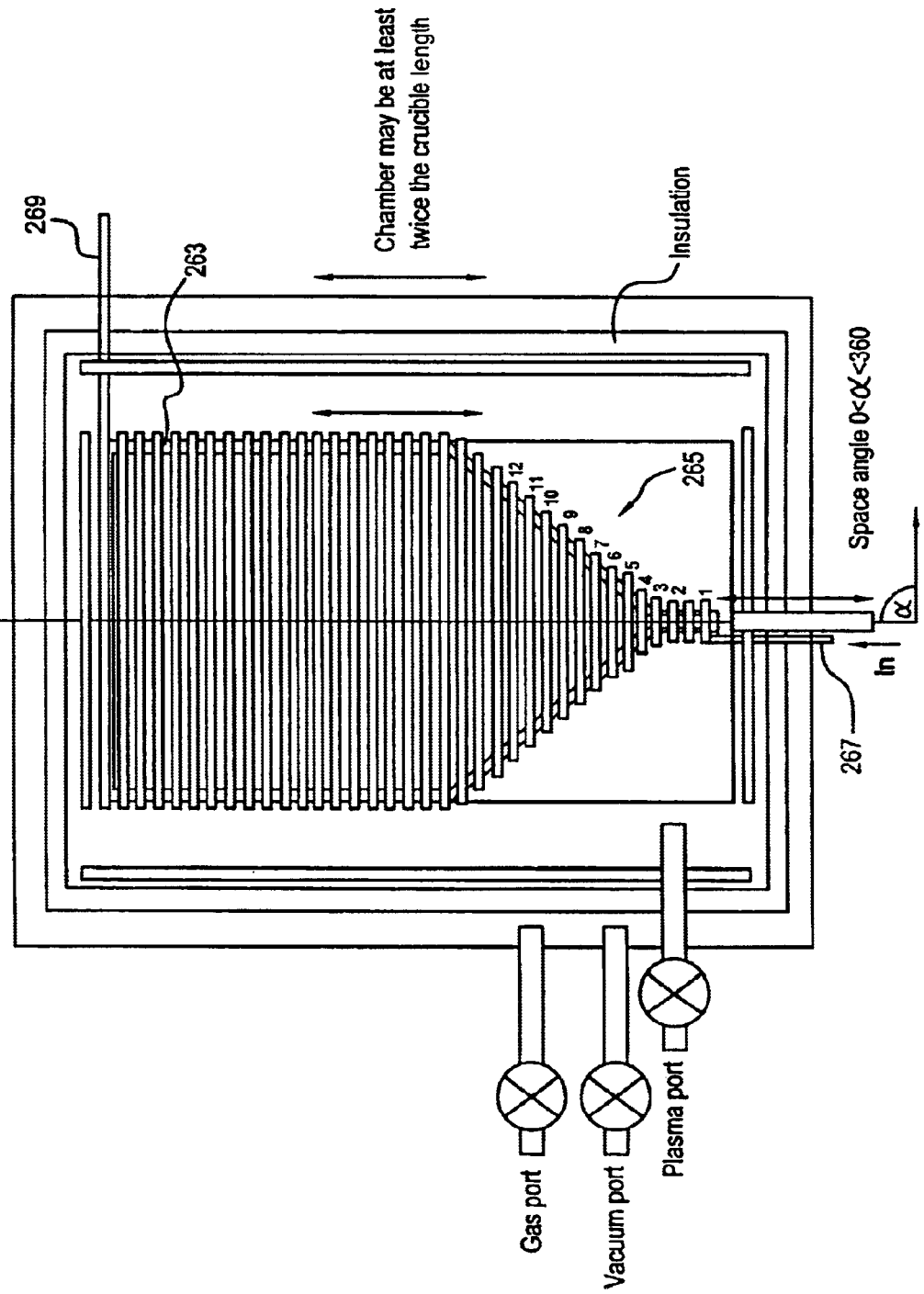
FIG. 11 is a schematic representation of a dynamic temperature control apparatus.

As shown in FIGS. 9–11, crystal growth occurs in a crucible 263 surrounded with a heat dissipation coil. The coil can be a simple coil having a single flow channel, or a comprehensive coil having one or more than one channels for flow of heat removing fluid. The fluid can be gas, liquid or molten material having the desired viscosity and heat removal properties.

The heat dissipation coil 265 can be one coil having inlet 267 and outlet 269, or can be comprised from more than one coil, each of them having an inlet and an outlet and each of them contributing to the temperature gradient for the crystal growth process desired. The width of each cooling band (CB-W) can be same or different. The spacing between the cooling bands (CB-S) can be the same or different, depending on the process requirements. Each individual band or connected group of bands may have separate sections for precisely controlling temperatures and heat flow.

The crucible for this growth can have plate shape, rectangular, round, polygonal or any other suitable shape. It may be surrounded with one or more layers of the same or different type material to achieve the desired temperature gradients and temperature distributions.

This cooling arrangement can be used in finite crystal growth within one or more crucibles or with continuous crystal growth of a plate or a bar.

The heat dissipation coil 265 can have bands made of partial or full segments that can be top, bottom, side, or any combination there between. Each segment can have one or more heat-removing elements.

The heat dissipation coil elements can be perpendicular to the crystal growth direction, as shown in FIG. 1, or can have any angle to the growth direction.

Each dissipation coil section can consist of one or more loops.

The pressing and heat treatment may be in vacuum in a reduced pressure of one or more inert or in reduced pressure of one or more reactive gases or plasma.

The pressing and heat treatment may be in reduced pressure of one or more inert and reactive gas mixtures.

In the new process and apparatus, the temperature distribution over each heating plate may have desired temperature distribution for process control. The temperature distribution over each heating plate may be non uniform and might have rectangular, polygonal, round, oval or any other desired shape temperature distribution for process control. The temperature distribution over each heating plate may comprise a uniform temperature background having areas or higher or lower temperature superimposed on it that can be uniform and that might have rectangular, polygonal, round, oval or any other desired shape temperature distribution for process control. The temperature distribution over each heating plate may have desired temperature distribution as required by the processes for the product being treated or fabricated.

Reactive gases and reactive substances can be any chemical compound that reacts with the substance being purified. The reactive substance can be gaseous, liquid or solid element or compound. The reactive substance can be elemental gas or organic or inorganic gaseous compound or mixture in its neutral or ionized state.

The material being processed may be composite of many compounds and the end product is an optical lens material, or any substance for making optical elements, or any scintillation oxide material.

The purification apparatus for crystal starter material has a chamber with bottom and side walls. A lid covers the chamber and has an opening for introducing liquid or solid material in the chamber. An outlet is positioned near or at the bottom of the chamber. A shut off valve is connected to the outlet for opening and closing the outlet. A source of reactive gas is connected to the chamber and extends into the chamber. A reactive gas release area extends to the near bottom of the chamber for slowly releasing reactive gas into and above the crystal starter material. A gaseous space at the top of the chamber withdraws gas from the top of the purified material. Heaters adjacent the chamber heat the chamber and the crystal starter material within the chamber.

A source of reactive gas is an in-line or other plasma generator.

Purification apparatus for crystal starter material has a reduced pressure chamber having vacuum port and vacuum valves, a gas delivery system, heating elements for heating the contents in the chamber, a container for material to be purified and a porous distributor to distribute reactive gas within and above the material being purified.

As shown in FIG. 9, the crucible 263 with the temperature control coils 265 are mounted within a double wall enclosure 273 with insulation 275. The heaters 277 may have the same shape as the crucible or may have different shapes, and may have more than one heater. Smaller heaters 279 move along the crucible within the larger heater 277. Heaters 277 and 279, or heater parts thereof, surround the crucible or are parallel to the longest side of the crucible.

At least one plasma port 281 with a plasma valve 283 is mounted in the enclosure 273. Multiport 275 and control valve assembly 277 admits inert or reactive gas or plasma. Vacuum port 279 and valve 281 control pressure in the enclosure.

The enclosure may be a pressure-containing chamber suitable for withstanding positive or negative pressure differentials of from vacuums to about 20 atmospheres or higher.

The chamber may be tilted in any direction.

The crucible may be partially or fully open on one of the sides for the purposes of loading and unloading crystal. The open portion may have a lid that is solid or have openings for vacuuming the area above the crystal, or to provide a controlled atmosphere over the exposed crystal or crystal melt area.

In the present binary and ternary fluoride purification and crystal growth method and apparatus, the material being processed or pressed is single crystal or polycrystalline material. Powder material may be used. The material may have uniform properties over the entire body, or may have desired composition within certain sections of the body. The material may be alkali halide, sodium iodide, cesium iodide, calcium fluoride or barium fluoride. Any binary metal fluoride compound or any binary compound may be used. The material being processed may be $Ca_xSR_{1-x}F_2$, where $0 Ca_x$ $Ca_x \leq X \leq 1$ or any ternary compound containing fluoride, any ternary compound or any quaternary compound.

The material being processed may be any metallic, non-metallic or any combination between them compound.

The material being processed may be doped or undoped sodium iodide or cesium iodide.

The reactive substance can be elemental gas or organic or inorganic gaseous compounds mixture in neutral or ionized state mixed with a carrier gas. The reactive gas can be fluorine gas, $F_2$. The reactive gas can be fluorine gas, $F_2$ mixed with carrier gas that can be any inert gas or any suitable inorganic or organic compound in gaseous form. The reactive gas can be fluorine gas, $F_2$ in its atomic state mixed with carrier gas that can be any inert gas or any suitable inorganic or organic compound in gaseous form.

The reactive gas can be fluorine gas, $F_2$ in its atomic state obtained via chemical reaction and/or passing fluorine gas through an ion generator. The reactive gas can be fluorine gas, $F_2$ in its atomic state obtained via chemical reaction and/or passing fluorine gas through an ion generator mixed with carrier gas that can be any inert gas or any suitable inorganic or organic compound in gaseous form. The ion generator can be a plasma generator.

The reactive gas can be fluorine gas, $F_2$ in its molecular and atomic state obtained via chemical reaction and/or passing fluorine gas through a plasma generator where only part of the gas is dissociated into atoms or where some of the atoms recombine after the ionization and form neutral molecules.

The reactive gas can be fluorine gas, $F_2$ in its molecular and atomic state obtained via chemical reaction and/or passing fluorine gas through a plasma generator where only part of the gas is dissociated into atoms or where some of the atoms recombine after the ionization and form neutral molecules mixed with carrier gas that can be any inert gas or any suitable inorganic or organic compound in gaseous form.

The reactive gas is a mixture between fluorine atoms, fluorine molecules obtained through two different sources and combined for purification purposes. The reactive gas is a mixture between fluorine atoms, fluorine molecules obtained through two different sources and combined for purification purposes mixed with carrier gas that can be any inert gas or any suitable inorganic or organic compound in gaseous form. The reactive gas is a mixture between fluorine atoms, fluorine molecules and other fluorine organic or inorganic molecules in neutral or charged state.

In some embodiments, the reactive gas is a mixture between fluorine atoms, fluorine molecules and other fluorine organic or inorganic molecules in neutral or charged state mixed with carrier gas that can be any inert gas or any suitable inorganic or organic compound in gaseous form. The reactive gas is a mixture between fluorine atoms, fluorine molecules and other fluorine organic or inorganic molecules in neutral or charged state and/or their ions created by passing them through an ionization apparatus. The reactive gas is a mixture between fluorine atoms, fluorine molecules and other fluorine organic or inorganic molecules in neutral or charged state or their ions created by passing them through an ionization apparatus mixed with carrier gas that can be any inert gas or any suitable inorganic or organic compound in gaseous form.

The reactive gas can be carbon tetrafluoride, $CF_4$.

The reactive gas can be carbon tetrafluoride gas, $CF_4$ mixed with carrier gas that can be any inert gas or any suitable inorganic or organic compound in gaseous form. The reactive gas can be fluorine gas, $F_2$, fluorine in its atomic state and $CF_4$. The reactive gas can be fluorine gas, $F_2$, fluorine in its atomic state and $CF_4$ mixed with carrier gas that can be any inert gas or any suitable inorganic or organic compound in gaseous form.

The reactive gas can be $CF_4$ gas, ionized $CF_3$ radicals, and fluorine in its atomic and molecular state obtained via chemical reaction and/or passing fluorine gas through an ion generator. The reactive gas can be $CF_4$ gas, ionized $CF_3$ radicals, and fluorine in its atomic and molecular state obtained via chemical reaction and/or passing fluorine gas through an ion generator mixed with carrier gas that can be any inert gas or any suitable inorganic or organic compound in gaseous form. The ion generator can be a plasma generator.

In one embodiment, the reactive gas is a mixture between fluorine atoms, and $CF_4$ molecules obtained through two different sources and combined for purification purposes. The reactive gas is a mixture between fluorine atoms, fluorine molecules and $CF_4$ obtained through two different sources and combined for purification purposes mixed with carrier gas that can be any inert gas or any suitable inorganic or organic compound in gaseous form.

The reactive gas can be a mixture between carbon tetrafluoride, carbon tetrafluoride radicals such as $CF_3$ or other, fluorine atoms and molecules and other fluorine organic or inorganic molecules in neutral or charged state. The reactive gas can be a mixture between carbon tetrafluoride, carbon tetrafluoride radicals such as $CF_3$ or other, fluorine atoms and molecules and other fluorine organic or inorganic molecules in neutral or charged state mixed with carrier gas that can be any inert gas or any suitable inorganic or organic compound in gaseous form. The reactive gas can be a mixture between carbon tetrafluoride, carbon tetrafluoride radicals such as $CF_3$ or other, fluorine atoms and molecules and other fluorine organic or inorganic molecules in neutral or charged state and/or their ions created by passing them through an ionization apparatus.

The reactive gas mixture between carbon tetrafluoride, carbon tetrafluoride radicals such as $CF_3$ or other, fluorine atoms and molecules and other fluorine organic or inorganic molecules in neutral or charged state and/or their ions created by passing them through an ionization apparatus mixed with carrier gas that can be any inert gas or any suitable inorganic or organic compound in gaseous form.

Other reactive gases may replace $F_2$, such as bromine and bromine based compound, chlorine and chlorine based compounds, hydrogen and hydrogen based compounds, etc.

Reactive solids may have several compositions, such as metal fluorides such as $ZnF_2$, $PbF_2$, other metal fluorides, and all inorganic or organic compounds that incorporate them. The same is true with the bromine and bromides, etc. in solid form.

While the invention has been described with reference to specific embodiments, modifications and variations of the invention may be constructed without departing from the scope of the invention, which is defined in the following claims.

I claim:

1. Continuous crystal plate growth apparatus comprising a source of starter material, a valve for supplying material from the starter material source, a first, hot zone communicating with the valve for heating the material, a dopant source, a dopant controller connected to the dopant source and connected to the hot zone for supplying dopant into the material in the hot zone, a second reduced heat zone connected to the hot zone for reducing heat in the material and forming a solid crystal plate from the material, a receiver connected to the reduced heat zone for receiving solid plate from the second, reduced heat zone and advancing the solid plate, a lowered temperature heating zone adjacent the receiver for lowering temperature of the solid crystal plate on the receiver, an enclosure enclosing the zones and the solid crystal plate, a controlled gaseous environment within the enclosure, and a plasma source for providing plasma to the gaseous environment.

2. The apparatus of claim 1, further comprising a large heater and a small heater, the large heater having first and second zones and the small heater having the first hot and second reduced heat zones, baffles separating the first and second zones of the heaters, and wherein the first and second zones and first hot and second reduced heat zones comprise multiple controlled zones.

3. The apparatus of claim 2, wherein the first zone of the small heater has multiple zones which produce crystal melt temperatures higher than a crystal melting temperature of the material, wherein the second zone of the small heater has multiple zones which produces temperatures lower than the melting temperature, wherein the temperature in the material at the baffle is about the melting temperature, wherein the large heater first zone has multiple zones which provide heats to below the melting temperature, and wherein the large heater second zone has multiple heaters which provide lower heats.

4. The apparatus of claim 1, wherein the receiver and the zones relatively move at a speed equal to a crystal growth rate.

5. The apparatus of claim 1, wherein the source of starter material is a source of alkali halide, a binary, ternary or quaternary compound or a metallic compound.

6. The apparatus of claim 1, further comprising purification apparatus for the crystal starter material, comprising a chamber having a bottom and sides, a lid covering the chamber, an opening for introducing liquid or solid material into the chamber, an outlet near the bottom of the chamber for releasing crystal starter material from the chamber, a shut-off valve connected to the outlet for opening and closing the outlet, a source of reactive or inert gas or plasma connected to the chamber and extending into a bottom of the chamber, a gas release barrier near the bottom of the chamber for slowly releasing reactive gas into the crystal starter material, a gas space at the top of the chamber above the crystal starter material, an exhaust line connected to the space at the top of the chamber for withdrawing gas from the top of the chamber, a heater adjacent the chamber for heating the chamber and the crystal starter material within the chamber, and a plasma source connected to the chamber.

7. The apparatus of claim 6, wherein the heater comprises multiple controlled zone heating elements around sides of the chamber.

8. The apparatus of claim 6, wherein the heater comprises multiple controlled heating elements along the walls of the chamber.

9. The apparatus of claim 6, wherein the purification apparatus is rockable or tippable and wherein the shut-off valve comprises one or more thermally activated shut-off valves.

10. The apparatus of claim 6, wherein the purification apparatus is rockable or tippable, and wherein the shut-off valve comprises one or more mechanical or electromechanical valves.

11. The apparatus of claim 6, wherein the opening further comprises an inlet conduit connected to the lid and a source of crystal starter material and reactive liquid or solid connected to the inlet conduit, and a valve connected between the source of reactive liquid or solid, and a plug connected to the conduit for plugging the conduit after adding reactive liquid or solid to the chamber.

12. The apparatus of claim 6, further comprising a plasma source connected to the chamber.

13. The apparatus of claim 6, further comprising an insulated enclosure around the chamber.

14. The apparatus of claim 6, further comprising a wall surrounding the chamber with an evacuated space between the wall and the chamber.

15. Purification apparatus for crystal starter material, comprising a chamber having a bottom and side walls, a lid covering the chamber, an opening for introducing liquid or solid material into the chamber, an outlet near the bottom of the chamber for releasing purified crystal starter material from the chamber, a shut-off valve connected to the outlet for opening and closing the outlet, a source of inert, reactive gas or plasma connected to the chamber and extending into a bottom of the chamber, a gas release barrier near the bottom of the chamber for slowly releasing inert reactive gas or plasma into the crystal starter material, a gaseous space at the top of the chamber above the crystal starter material, an exhaust line connected to the space at the top of the chamber for withdrawing gas from the top of the chamber, and multizone heaters adjacent the chamber for heating the chamber and the crystal starter material within the chamber.

16. The apparatus of claim 15, wherein the heater comprises multiple controlled zone heating elements around sides of the chamber.

17. The apparatus of claim 15, wherein the heater comprises multiple controlled zone heating elements along the bottom of the chamber.

18. The apparatus of claim 15, wherein the purification apparatus is rockable or tipple and wherein the shut-off valve comprises one or more thermally activated shut-off valve.

19. The apparatus of claim 15, wherein the purification apparatus is rockable or tippable and wherein the shut-off valve comprises one or more mechanical or electromechanical valve.

20. The apparatus of claim 15, wherein the opening further comprises an inlet conduit connected to the lid and a source of crystal starter material and reactive liquid and solid connected to the inlet conduit, and a valve connected between the source of reactive liquid or solvent, and a plug connected to the conduit for plugging the conduit after adding reactive liquid or solid to the chamber.

21. The apparatus of claim 15, further comprising a plasma source connected to the chamber.

22. The apparatus of claim 15, further comprising an insulated enclosure around the chamber.

23. The apparatus of claim 15, further comprising a wall surrounding the chamber with an evacuated space between the wall and the chamber.

24. Heating and purifying apparatus, comprising a chamber having an inlet and an outlet, a source of material connected to the inlet and a purified material discharge connected to the outlet, an enclosure having side walls, a bottom and a top, a heater connected to the enclosure, a reactive gas source, a gas valve connected to the gas source and a gas inlet tube connected to the valve, a gas distributor mounted in the chamber near the bottom, a gas releasing plate connected to the gas distributor for releasing the reactive gas from the inlet tube and the distributor into the material in the feeding and purifying apparatus, multiple zone heaters connected to the chamber for heating material in the chamber, a gas exhaust connected to an upper portion of the chamber for exhausting gas from an upper portion of the chamber, and a plasma source connected to the chamber.

25. The apparatus of claim 24, further comprising a casing having a cover and side walls, and wherein the casing side walls comprise the chamber side walls, and insulation interposed between the casing and the chamber.

26. The apparatus of claim 24, wherein the heater comprises an upper heater having multiple zone heating elements across a top of the chamber.

27. The apparatus of claim 24, wherein the heater comprises heating elements having multiple controlled zones in a ceramic matrix extending across a bottom of the chamber.

28. The apparatus of claim 24, wherein the gas releasing plate comprises a porous quartz plate for releasing reactive gas and plasma and inert gas.

29. The apparatus of claim 24, wherein the heater comprises a radiant heater having multiple controlled zones positioned near the chamber.

30. The apparatus of claim 24, wherein the heater comprises a first top heater having heating elements with multiple controlled zones extending across the top of the chamber, and a second bottom heater having heating elements with multiple controlled zones extending across a bottom of the chamber.

31. The apparatus of claim 24, wherein the heater comprises a top heater having heating elements extending across a top of the chamber, and first and second side heaters having heating elements each having multiple controlled zones extending along sides of the chamber.

32. The apparatus of claim 31, further comprising a heater extending along a bottom of the chamber and having heating elements each having multiple controlled zones extending along the bottom of the chamber.

33. The apparatus of claim 24, wherein the heater comprises a radiant heater having multiple controlled zones spaced above the chamber for directing heat flux downward into the material in the chamber.

34. The apparatus of claim 24, wherein the bottom of the chamber comprises a relatively movable base for supporting the material.

35. The apparatus of claim 34, wherein the base and the heaters relatively move for transporting material with respect to the chamber.

36. The apparatus of claim 24, wherein the apparatus moves with respect to a stationary base for supporting a growing crystal.

37. Crystal growth apparatus comprising a support for supporting a growing crystal, a first multiple zone heater adjacent the growing crystal for heating the growing crystal and liquefying the growing crystal, a second multiple zone heater spaced from the first multiple zone heater along the growing crystal for re-liquefying the growing crystal, and a plasma source connected to the chamber.

38. The apparatus of claim 37, further comprising multiple zone heaters spaced from each other along the growing crystal for liquefying the growing crystal, and reactive gas, inert gas and plasma distributors adjacent the liquefying.

39. The apparatus of claim 37, wherein the first zone heater further comprises heating and purifying apparatus for purifying the crystal melt.

40. The apparatus of claim 39, wherein the first zone heater comprises a reactive gas distributor for distributing reactive and inert gas and plasma from near a bottom of the crystal melt.

41. The apparatus of claim 40, further comprising a liquid or solid adaptive substance source for releasing liquid or solid reactive substance into the melt.

42. The apparatus of claim 40, wherein the last multiple zone heater further comprises a source of dopant connected to the heater for supplying dopant into the crystal melt.

43. The apparatus of claim 40, wherein the support comprises a movable support for moving the liquid crystal along zone heaters.

44. The apparatus of claim 40, wherein the zone heaters move along the crystal.

45. Crystal growth apparatus comprising a chamber for holding a crystal melt, a crystal support holding a crystal movable with respect to the chamber for forming a bottom of the chamber with the crystal, a first multiple zone heater adjacent the chamber for heating and maintaining a crystal melt within the chamber, a baffle connected to the first multiple zone heater adjacent a bottom of the chamber, a second multiple zone heater connected to the baffle beyond the first heater, a source of reactive and inert gas and plasma, a controller connected to the source of reactive and inert gas and plasma, a gas tube connected to the controller, a distributor connected to the gas tube and mounted in the chamber for positioning within the crystal melt, a gas releaser connected to the distributor for releasing reactive and inert gas and plasma into the crystal melt, and a gas exhaust connected to the chamber for exhausting gas from the chamber above the crystal melt.

46. The apparatus of claim 45, further comprising an inlet tube connected to the chamber and a controller connected to the inlet tube for releasing reactant substance into the chamber and into the crystal melt.

47. The apparatus of claim 45, further comprising a dopant conduit connected to the chamber and a dopant source connected to the conduit for providing a dopant from the source through the conduit to the chamber.

48. The apparatus of claim 47, wherein the reactive substance and the reactive gas control the dopant.

49. The process for crystal growth, comprising holding a crystal melt in a chamber, holding a crystal in a crystal support, moving the support with respect to the chamber, forming a bottom of the chamber, heating and maintaining a crystal melt temperature within the chamber, separating heating of the chamber from a crystal by a baffle adjacent a bottom of the chamber, heating the crystal with a second heater, releasing reactive and inert gas and plasma into the crystal melt, and exhausting gas from the chamber above the crystal melt.

50. The process for heat treating crystals, comprising placing a formed and cut crystal on a platform, enclosing sides of the crystal, placing a lid on top of the crystal, applying inward force to the sides and the top to press the crystal inward, heating the crystal, increasing force on the crystal, maintaining force and heating the crystal for a predetermined time, reducing force and reducing heat, cooling the annealed crystal and withdrawing the cooled crystal, wherein the crystal is a single crystal, polycrystalline or powdered material.

51. The process of claim 50, wherein the material being pressed has uniform material properties over the entire body, or has composition within certain sections of the body.

52. The process of claim 50, wherein the material being pressed is alkali halide material, sodium iodide, cesium iodide, calcium fluoride or barium fluoride.

53. The process of claim 49, wherein the crystal is a ternary metal fluoride compound $Ca_xBa_{1-x}F_2$ where $0 \leq x \leq 1$ or $Ca_xSr_{1-x}F_2$ where $0 \leq x \leq 1$.

54. The process of claim 49, wherein the crystal is a ternary compound or a quaternary compound.

55. The process of claim 49, wherein the crystal is silicon, silicon and germanium, $Si_xGe_{1-x}$ solid solution, silicon and silicon carbide $Si_x(SiC)_{1-x}$, silicon and silicon dioxide $Si_x(SiO_2)_{1-x}$, silicon and any ceramic, silicon and any oxide $Si_x(Oxide)_{1-x}$, silicon and any metal $Si_xM_{1-x}$, silicon and any alloy $Si_xA_{1-x}$, or any combination thereof.

56. The process of claim 55, wherein the crystal is mixed with organic and/or inorganic substances to form a slurry, or solid substance in form of powder, shot or any size and shape material suitable for the process.

57. The process of claim 49, wherein the crystal is a composite of many compounds and the end product is an optical lens material.

58. The process of claim 49, wherein the crystal is a substance for making optical elements.

59. The process of claim 49, wherein the crystal is a scintillation oxide material.

60. The process of claim 50, wherein the heat treating is in a vacuum.

61. The process of claim 50, wherein the heat treating is in reduced pressure of one or more inert or reactive gases.

62. The process of claim 50, wherein the heating further comprises controlling the temperature distribution over heating plates.

63. The process of claim 62, wherein the temperature distribution over each heating plate is non uniform and the plates might have rectangular, polygonal, round, or oval shape temperature distribution for process control.

64. Purification apparatus for crystal starter material, comprising a chamber having bottom and side walls, a lid covering the chamber, an opening for introducing liquid or solid material in the chamber, an outlet near or at the bottom of the chamber, a shut off valve connected to the outlet for opening and closing the outlet, a source of reactive gas connected to the chamber and extending into the chamber, a reactive gas release area extending to the near bottom of the chamber for slowly releasing reactive gas into and above the crystal starter material, gaseous space at the top of the chamber for withdrawing gas from the top of the purified material, and a heater adjacent the chamber for heating the chamber and the crystal starter material within the chamber.

65. The apparatus of claim 64, wherein the source of reactive gas is an in-line or other plasma generator.

66. Purification apparatus for crystal starter material, comprising a reduced pressure chamber having a vacuum port and vacuum valves, a gas delivery system, heating elements for heating the contents in the chamber, a container for material to be purified and a porous distributor to distribute reactive gas within and above the material being purified.

67. The apparatus of claim 66, wherein the source of reactive gas is an in-line or other plasma generator.

68. The apparatus of claim 66, further comprising a source of reactive substance that is gaseous, liquid or solid element or compound.

69. The apparatus of claim 68, wherein the source of the reactive substance is a source of elemental gas or organic or inorganic gaseous compound or a mixture thereof in neutral or ionized state.

70. The apparatus of claim 69, wherein the source of the reactive substance further comprises a source of carrier gas.

71. The apparatus of claim 66, wherein the reactive gas is fluorine gas, $F_2$.

72. The apparatus of claim 66, wherein the reactive gas is fluor gas, $F_2$ mixed with carrier gas that is an inert gas or an inorganic or organic compound in gaseous form.

73. The apparatus of claim 72, wherein the $F_2$ is in its atomic state.

74. The apparatus of claim 73, wherein the $F_2$ in its atomic state is obtained via chemical reaction and/or passing fluorine gas through an ion generator.

75. The apparatus of claim 73, wherein the $F_2$ in its atomic state is mixed with carrier gas that is an inert gas or inorganic or organic compound in gaseous form.

76. The apparatus of claim 74, wherein the ion generator is a plasma generator.

77. The apparatus of claim 76, wherein in the plasma generator only part of the gas is dissociated into atoms or where some of the atoms recombine after the ionization and form neutral molecules.

78. The apparatus of claim 66, wherein the reactive gas is a mixture between fluorine atoms and fluorine molecules obtained through two different sources and combined for purification purposes.

79. The apparatus of claim 78, wherein the reactive gas mixture is mixed with carrier gas that is an inert gas or an inorganic or organic compound in gaseous form.

80. The apparatus of claim 66, wherein the reactive gas is carbon tetrafluoride, $CF_4$.

81. The apparatus of claim 66, wherein the reactive gas is carbon tetrafluoride gas, $CF_4$ mixed with carrier gas that is an inert gas or inorganic or organic compound in gaseous form.

82. The apparatus of claim 66, wherein the reactive gas is fluorine gas, $F_2$, fluorine in its atomic state and $CF_4$.

83. The apparatus of claim 66, wherein the reactive gas is $CF_4$ gas, ionized $CF_3$ radicals, and fluorine in its atomic and molecular state obtained via chemical reaction and/or passing fluorine gas through an ion generator.

84. The apparatus of claim 83, wherein the ion generator is a plasma generator.

85. The apparatus of claim 66, wherein the reactive gas is a mixture between carbon tetrafluoride, carbon tetrafluoride radicals such as $CF_3$ or other, fluorine atoms and molecules and other fluorine organic or inorganic molecules in neutral or charged state.

86. The apparatus of claim 66, wherein the reactive gas is a mixture between carbon tetrafluoride, carbon tetrafluoride radicals such as $CF_3$ or other, fluorine atoms and molecules and other fluorine organic or inorganic molecules in neutral or charged state and/or their ions created by passing them through an ionization apparatus.

87. The apparatus of claim 66, wherein the reactive gases are selected from bromine, bromine-based compound, chlorine, chlorine-based compounds, hydrogen, hydrogen-based compounds, and mixtures thereof.

88. The apparatus of claim 66, further comprising reactive solids selected from metal fluorides, $ZnF_2$, $PbF_2$, and inorganic or organic compounds that incorporate them.

* * * * *